United States Patent
Sang et al.

(10) Patent No.: US 10,332,434 B2
(45) Date of Patent: Jun. 25, 2019

(54) RESET CIRCUIT, SHIFT REGISTER UNIT, AND GATE SCANNING CIRCUIT

(71) Applicants: BOE TECHNOLOGY GROUP CO., LTD., Beijing (CN); BEIJING BOE DISPLAY TECHNOLOGY CO., LTD., Beijing (CN)

(72) Inventors: Qi Sang, Beijing (CN); Baoqiang Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/528,053

(22) PCT Filed: Nov. 7, 2016

(86) PCT No.: PCT/CN2016/104883
§ 371 (c)(1),
(2) Date: May 18, 2017

(87) PCT Pub. No.: WO2017/152643
PCT Pub. Date: Sep. 14, 2017

(65) Prior Publication Data
US 2018/0366047 A1    Dec. 20, 2018

(30) Foreign Application Priority Data

Mar. 8, 2016    (CN) .......................... 2016 1 0131389

(51) Int. Cl.
*G06F 1/00*    (2006.01)
*G09G 3/20*    (2006.01)
(Continued)

(52) U.S. Cl.
CPC ............ *G09G 3/20* (2013.01); *G06F 3/0412* (2013.01); *G06F 3/0416* (2013.01);
(Continued)

(58) Field of Classification Search
CPC ......... G11C 27/04; G06F 3/038; G06F 3/041; G06F 3/0416; G09G 3/36; G09G 3/20
See application file for complete search history.

(56) References Cited

U.S. PATENT DOCUMENTS 9,799,295 B2 * 10/2017 Zhao .................... G09G 3/3677
2015/0016584 A1 * 1/2015 Dun ....................... G11C 27/04
377/68

FOREIGN PATENT DOCUMENTS

CN    104282287 A    1/2015
CN    104318886 A    1/2015
(Continued)

OTHER PUBLICATIONS

International Search Report and Written Opinion dated Jan. 26, 2017 in PCT/CN2016/104883.

*Primary Examiner* — Michael A Faragalla
(74) *Attorney, Agent, or Firm* — Syncoda LLC; Feng Ma

(57) ABSTRACT

A reset circuit for compensating a level reduction at a first node during a first stage without affecting levels during a second stage includes a reset portion, a reset control portion, and at least three input terminals. The reset portion is coupled to the first and second input terminals, and a second node, and is configured to be turned on if the second node is at a first level, to electrically couple the second and first input terminals. The reset control portion is coupled to the first, second, and third input terminals, and the second node, and is configured to electrically couple the second input terminal with the second node if the first input terminal is at the first level, and to electrically couple the second node (Continued)

with the third input terminal if the second input terminal is at a second level.

20 Claims, 6 Drawing Sheets

(51) Int. Cl.
  *G06F 3/041* (2006.01)
  *G11C 19/28* (2006.01)
(52) U.S. Cl.
  CPC ... *G11C 19/287* (2013.01); *G09G 2300/0819* (2013.01); *G09G 2310/0286* (2013.01)

(56) References Cited

FOREIGN PATENT DOCUMENTS

| | | |
|---|---|---|
| CN | 104575437 A | 4/2015 |
| CN | 104809985 A | 7/2015 |
| CN | 105589604 A | 5/2016 |
| EP | 2963635 A1 | 1/2016 |
| WO | 2014054517 A1 | 4/2014 |

\* cited by examiner

RESET CIRCUIT, SHIFT REGISTER UNIT, AND GATE SCANNING CIRCUIT

CROSS-REFERENCE TO RELATED APPLICATION

The present application claims priority to Chinese Patent Application No. 201610131389.2 filed on Mar. 8, 2016, the disclosure of which is hereby incorporated by reference in its entirety.

TECHNICAL FIELD

This present disclosure relates generally to display technologies, and more specifically to a reset circuit and a driving method thereof, a shift register unit, and a gate scanning circuit.

BACKGROUND

In conventional in-cell touch display technologies, the scan-driving process during display and the scan-driving process during touch detection need to be separated in order not to interfere with normal display and normal touch control.

During the process of gate scanning, there is typically a touch detection process between scanning of every two adjacent gate lines. In the touch detection process as shown in FIG. 1, a high level needs to be maintained at the node PU of the shift register unit to which the gate scanning circuit at the moment shifts. This allows the output of a corresponding gate scanning signal after the touch detection process.

Herein the node PU is configured to control the output of scanning signals. The control terminal of the output module in a corresponding shift register is coupled to the node PU and is configured to output a scanning signal upon a high level at the node PU.

Because the touch detection process typically takes a relatively long time, electrical leakage is prone to occur at the node PU, thereby causing the gate scanning signals unable to be normally output after the touch detection process.

SUMMARY

The present disclosure provides a reset circuit and a driving method thereof, a shift register unit, and a gate scanning circuit, aiming at solving the issue that the gate scanning signals cannot be normally output after touch detection, which results from the electrical leakage occurring at the node PU due to the relatively long touch detection process.

In a first aspect, a reset circuit for compensating a reduction of a level at a first node of a circuit during a first stage without affecting levels at the first node during a second stage is disclosed herein. The reset circuit comprises a reset unit, a reset control unit, and at least three input terminals.

The at least three input terminals comprise a first input terminal, a second input terminal, and a third input terminal, wherein the first input terminal is coupled to the first node.

The reset unit is coupled to the first input terminal, the second input terminal, and a second node, and is configured to be turned on if the second node is at a first level, so as to electrically couple the second input terminal with the first input terminal.

The reset control unit is coupled to the first input terminal, the second input terminal, the third input terminal, and the second node, and is configured to electrically couple the second input terminal with the second node if the first input terminal is at the first level, and to electrically couple the second node with the third input terminal if the second input terminal is at a second level.

In the reset circuit according to some embodiments of the present disclosure, the first stage comprises an interrupt stage, and the second stage comprises at least one stage other than the interrupt stage.

In some embodiments of the present disclosure, the reset unit comprises a first transistor. The first transistor is configured to be turned on by a level substantially equal to the first level. A gate electrode of the first transistor is coupled to the second node; one of a source electrode and a drain electrode of the first transistor is coupled to the first input terminal; and another of the source electrode and the drain electrode is coupled to the second input terminal.

The reset unit can comprise a first control subunit and a second control subunit. The first control subunit is coupled to the first input terminal, the second input terminal, and the second node, and is configured to be turned on if the first input terminal is at the first level, so as to electrically couple the second node with the second input terminal. The second control subunit is coupled to the third input terminal, the second node, and a third node, and is configured to turned on if a voltage at the third node is substantially equal to an effective level of the second control subunit, so as to electrically couple the second node with the third input terminal.

In some embodiments of the reset circuit, the effective level and an ineffective level of the second control subunit are substantially equal to the second level and the first level respectively, and the second input terminal is coupled to the third node.

In some other embodiments of the reset circuit, the effective level and an ineffective level of the second control subunit is substantially equal to the first level and the second level respectively, and the reset circuit further comprises a third control subunit.

The third control subunit is coupled to the second input terminal and the third node, and is configured to set a voltage at the third node to be the ineffective level of the second control subunit if the second input terminal is at the first level, and to set the voltage at the third node to be the effective level of the second control subunit if the second input terminal is at the second level.

In some embodiments of the reset circuit, the third control subunit can comprise a second transistor and a third transistor. The second transistor is configured to be turned on by a level substantially equal to the first level; and the third transistor is configured to be turned on by a level substantially equal to the effective level of the second control subunit.

A gate electrode of the second transistor is coupled to the second input terminal; one of a source electrode and a drain electrode of the second transistor is coupled to a fourth input terminal, and another of the source electrode and the drain electrode of the second transistor is coupled to the third node. A gate electrode, and one of a source electrode and a drain electrode, of the third transistor is coupled to a fifth input terminal, and another of the source electrode and the drain electrode of the third transistor is coupled to the third node.

In the reset circuit, the second control subunit can comprise a fourth transistor. The fourth transistor is configured to be turned on by a level substantially equal to the effective level of the second control subunit. A gate electrode of the fourth transistor is coupled to the third node; one of a source electrode and a drain electrode of the fourth transistor is coupled to the third input terminal; and another of the source electrode and the drain electrode of the fourth transistor is coupled to the second node.

In the reset circuit, the first control subunit can comprise a fifth transistor. The fifth transistor is configured to be turned on by a level substantially equal to the first level. A gate electrode of the fifth transistor is coupled to the first input terminal; one of a source electrode and a drain electrode of the fifth transistor is coupled to the second node; and another of the source electrode and the drain electrode of the fifth transistor is coupled to the second input terminal.

In the reset circuit as described above, the first level can be a high level, and the second level can be a low level.

According to some embodiments of the reset circuit, the third input terminal is coupled to a reset control signal terminal, configured to send a reset control signal to turn on the reset unit during the second stage.

In some embodiments of the reset circuit, the circuit can be a shift register unit.

The shift register unit as described above can be part of a gate scanning circuit; and the interrupt stage in the first stage as such can be a touch detection stage. The second stage can comprise a first scanning stage and a second scanning stage, configured such that a starting time of the interrupt stage is an ending time of the first scanning stage, and an ending time of the interrupt stage is a starting time of the second scanning stage; at the first scanning stage and the second scanning stage, the second input terminal is applied with the second level; and at the interrupt stage, the second input terminal is applied with the first level.

In a second aspect of the present disclosure, a shift register unit is further disclosed. The shift register unit can include the reset circuit according to any one of the embodiments as described above.

In the shift register unit, the reset circuit can be coupled to the shift register unit via the first node.

The shift register unit can further comprise an input circuit and an output circuit. The input circuit is coupled to a scan signal input terminal and the first node, and is configured to set the first node to be at the first level upon receiving a scan signal; and the output circuit is coupled to the first node via a control terminal, and is coupled to a clock signal input terminal and a scan signal output terminal, and is configured to output the scan signal from the scan signal output terminal if the first node is at the first level.

In the shift register unit, the second input terminal and the third input terminal of the reset circuit can be respectively coupled to a control signal terminal and a reset control signal terminal.

In a third aspect, the present disclosure further provides a gate scanning circuit. The gate scanning circuit comprises at least one shift register unit as described above.

The gate scanning circuit can comprise a plurality of shift register units. The plurality of shift register units can be coupled through a cascade connection; and the plurality of shift register units other than a first-level shift register unit and a last-level shift register unit can comprise at least one shift register unit.

In a fourth aspect, the present disclosure further provides a display apparatus, which comprises a gate scanning circuit as described above.

The display apparatus as such can be an in-cell touch display device, which can be selected from one of an e-paper, a cell phone, a tablet, a television, a monitor, a notebook computer, a digital camera, or a GPS.

In a fifth aspect, the present disclosure provides a method for driving a reset circuit according to any of the embodiments as described above. The method can comprise a first scanning stage, a second scanning stage, and the interrupt stage.

A starting time of the interrupt stage is an ending time of the first scanning stage, and an ending time of the interrupt stage is a starting time of the second scanning stage. At the first scanning stage and the second scanning stage, the second input terminal is applied with the second level. At the interrupt stage, the second input terminal is applied with the first level.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments as disclosed herein, the technical solutions of the embodiments of the disclosure will be described in a clear and fully understandable way.

It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
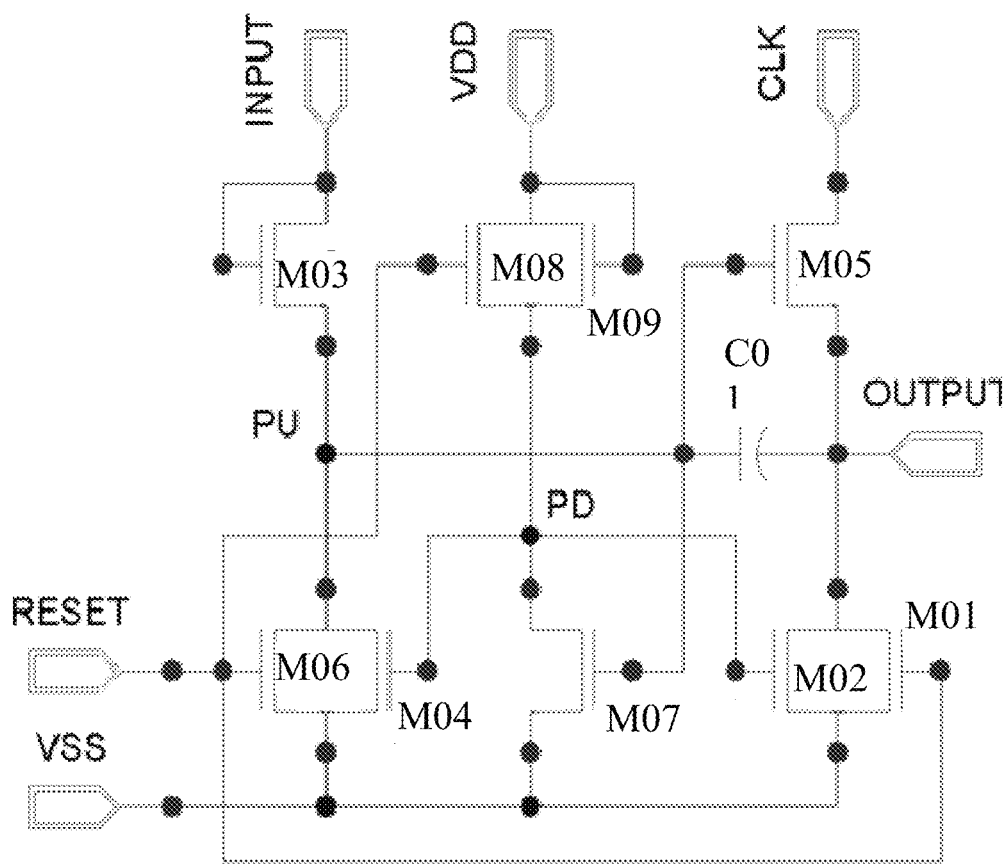
FIG. 1 is a schematic diagram of the circuit structure of a conventional shift register unit.

FIG. 1 is a schematic diagram of the circuit structure of a conventional shift register unit. As shown, the shift register unit comprises a total of nine N-type transistors including M01-M09, a capacitor C01, and a plurality of input terminals including CLK, VDD, INPUT, RESET, and VSS.

Figure 2:
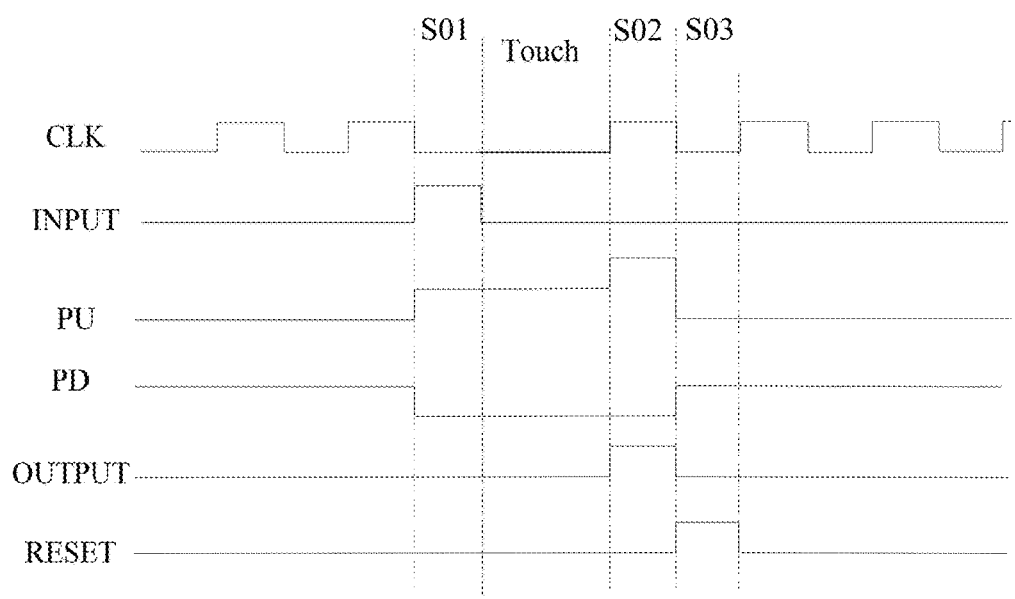
FIG. 2 is a schematic diagram illustrating the relationship between electrical potentials at key nodes and the key signals during the process of driving the shift register unit as shown in FIG. 1.

FIG. 2 is a schematic diagram illustrating the relationship between electrical potentials at key nodes and the key signals when driving the shift register unit as shown in FIG. 1. During operation, a clock signal is applied to the input terminal CLK, a high level to the input terminal VDD, a low level to the input terminal VSS, and a high-level pulse signal respectively to the input terminal INPUT and the input terminal RESET at different stages.

At Stage S01, upon application of a high level to the input terminal INPUT and a low level to the input terminal RESET, the transistor M03 is turned on, and the level at the node PU is pulled up, in turn causing turning-on of the transistor M05 and the transistor M07.

At the moment, because a low level is applied to the input terminal CLK, the output terminal OUTPUT is at low level, and thus does not output a high level. Because the transistor M07 is turned on, the node PD is at a low level (the transistor M07 has a stronger pull-down capability than the transistor M09 due to the channel of the transistor M07 having a higher width/length ratio than that of the transistor M09), causing turning-off of both the transistor M02 and the transistor M04. In addition, because a low level is applied to the input terminal RESET, the transistor M01 and the transistor M06 are both turned off.

Because the gate electrode and the source electrode of the transistor M09 are short-coupled and are both coupled to the input terminal VDD, the transistor M09 is maintained to be turned on at all stages.

At Stage S02, upon application of a low level to both the input terminal INPUT and the input terminal RESET, the transistor M05 and the transistor M07 remain turned on whereas the transistors other than M05, M07 and M09 are all turned off.

Because of a high level at the input terminal CLK, the output terminal outputs a high level. In addition, the high level at a second terminal of the capacitor C01 (shown as the terminal coupled to the output terminal OUTPUT in the figure) causes a voltage jump at the node PU.

At Stage S03, upon application of a low level to the input terminal INPUT, the transistor M03 is turned off, and upon application of a high level at the input terminal RESET, the transistors M06, M08 and M01 are turned on, causing a voltage at the node PU and a voltage at the output terminal OUTPUT to be both pulled down.

A pull-down of the voltage at the node PU causes an electrical cut-off of the transistor M07, resulting in an increase of the voltage at the node PD, which in turn causes the transistor M04 and the transistor M02 to be turned on.

Afterwards, because the node PU is maintained at a low level, the transistor M07 is turned off; and because the node PD is at a high level, the transistor M02 and the transistor M04 are maintained to be turned on, thereby causing a reset at the output terminal OUTPUT and an enhanced reset at the node PU.

During the process as mentioned above, a Touch (i.e. touch detection) stage is arranged between Stage S01 and Stage S02. In theory, during the Touch Stage, the node PU is maintained at a high level, thus the transistor M05 is turned on at Stage S02.

In real practice, however, due to the relatively long period of the Touch stage, an electrical leakage is prone to occur at the node PU, which causes the voltage at the node PU to reduce to a level lower than that required for the turning-on of the transistor M05. This in turn causes the transistor M05 unable to be turned on and the output terminal OUTPUT unable to output the scan signals.

During the process as mentioned above, the transistor M06 can reset the node PU, and thus serving a role as a reset circuit, and the input terminal RESET can control the reset circuit, and thus serving a role as a reset control signal terminal.

This present disclosure provides a reset circuit, which resets the aforementioned transistor M06 in a shift register unit, aiming at solving the technical problem that a conventional gate scanning circuit is unable to normally output gate scanning signals after the scanning is complete.

Figure 3:
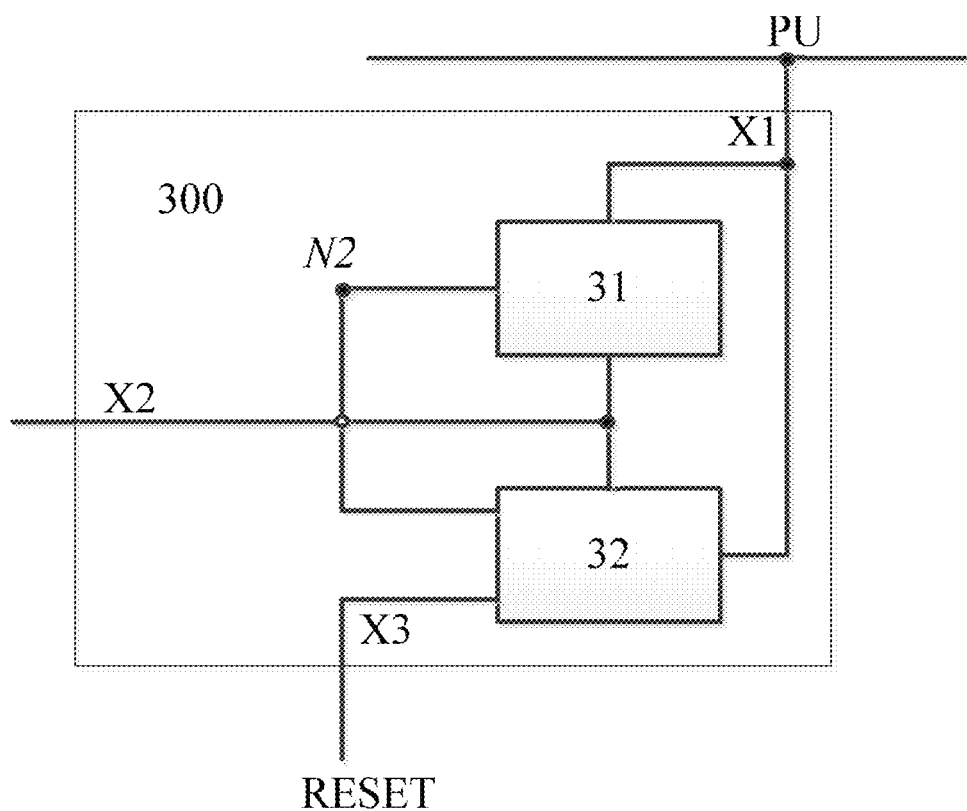
FIG. 3 is a structural diagram of a reset circuit according to some embodiments of the disclosure.

FIG. 3 is a schematic diagram of the structure of a reset circuit according to some embodiments of the disclosure. The reset circuit 300 comprises: a reset unit 31, a reset control unit 32, and at least three input terminals including a first input terminal X1, a second input terminal X2, and a third input terminal X3.

The first input terminal X1 is coupled to a node PU of a shift register unit, and the third input terminal X3 is coupled to a reset control signal terminal RESET of the shift register unit.

The reset unit 31 is coupled to the first input terminal X1, the second input terminal X2, and a second node N2, and is configured to be turned on when the node N2 is at a first level, so as to electrically couple the second input terminal X2 with the first input terminal X1.

The reset control unit 32 is coupled to the first input terminal X1, the second input terminal X2, the third input terminal X3, and the second node N2. The reset control unit 32 is configured to electrically couple the second input terminal X2 with the second node N2 when the first input terminal X1 is at the first level, and is configured to electrically couple the second node N2 with the third input terminal X3 when the second input terminal X2 is at a second level. The first input terminal X1 is coupled to the node PU.

Herein the first level can specifically be a high level, and the second level can specifically be a low level.

When the first level is a high level, that the first input terminal X1 of the reset control unit 32 is at the first level can specifically mean that a voltage at the first input terminal X1 of the reset control unit 32 is higher than a first preset voltage (i.e., a threshold voltage allowing the reset control unit 32 to electrically couple the second input terminal X2 with the second node N2); and correspondingly, that the first input terminal X1 is at the second level can thus specifically mean that the voltage at the first input terminal X1 is lower than the first preset voltage.

On the other hand, that the second input terminal X2 of the reset control unit 32 is at the first level can also mean that the voltage at the second input terminal X2 is higher than a second preset voltage (i.e., a threshold voltage allowing the reset control unit 32 to electrically cut off the connection between the second node N2 and the third input terminal X3); and correspondingly, that the second input terminal X2 of the reset control unit 32 is at the second level can thus specifically mean that the voltage at the second input terminal X2 is lower than the second preset voltage.

It is noted that the first preset voltage and the second preset voltage may be different.

As for the reset circuit as shown in FIG. 3, the following driving method can be applied in order to rest the corresponding shift register unit.

The driving method includes a first scanning stage, a second scanning stage, and a scanning termination stage. A starting time of the scanning termination stage is an ending time of the first scanning stage, and an ending time of the scanning termination stage is a starting time of the second scanning stage.

At the first scanning stage and the second scanning stage, the second input terminal X2 is applied with the second level; whereas at the scanning termination stage, the second input terminal X2 is applied with the first level.

As mentioned above, in practice the third input terminal X3 can be coupled to the reset control signal terminal RESET. As such, during scanning, the second level is applied to the second input terminal X2, causing the second node N2 and the third input terminal X3 to be electrically coupled, thus the second node N2 is normally electrically coupled to the reset control signal terminal RESET.

When the reset unit 31 is turned on upon a reset control signal from the reset control signal terminal RESET, the second input terminal X2 and the first input terminal X1 are electrically coupled, the first input terminal X1 is at the second level, thus realizing a normal reset to thereby allow the corresponding shift register to normally output scanning signals.

At the scanning termination stage, the first node PU is at the first level (e.g. in FIG. 1, a voltage at the first node PU at the scanning termination stage/Touch stage is maintained at a high level, or the first level), causing the second input terminal X2 to be electrically coupled to the second node N2.

As such, because a voltage of the first level is applied to the second input terminal X2, the second node N2 is set at the first level, thereby the reset unit 32 is turned on, causing the first input terminal X1 to be electrically coupled to the second input terminal X2. As a result, the first input terminal X1 and the second input terminal X2 are at a same level, causing the first node PU to be maintained at the first level.

As such, the reset circuit as shown in FIG. 3 allows a normal scanning and further allows, at the scanning termination stage, the first node PU in the corresponding shift register unit to be maintained at the first level as required for the output circuit to output the scanning signal.

It is noted that people of ordinary skills in the art can appreciate that regardless of how the specific structure of the rest control unit 32 is designed, as long as the input terminal is able to realize a corresponding function upon application of a level, the corresponding reset circuit can achieve the basic purpose of the present disclosure, and the corresponding technical solutions shall be covered by the scope of the present disclosure.

In the following, an example is provided to give a detailed explanation by referencing the reset unit 31, the reset control unit 32, and their driving method as mentioned above.

Figure 4:
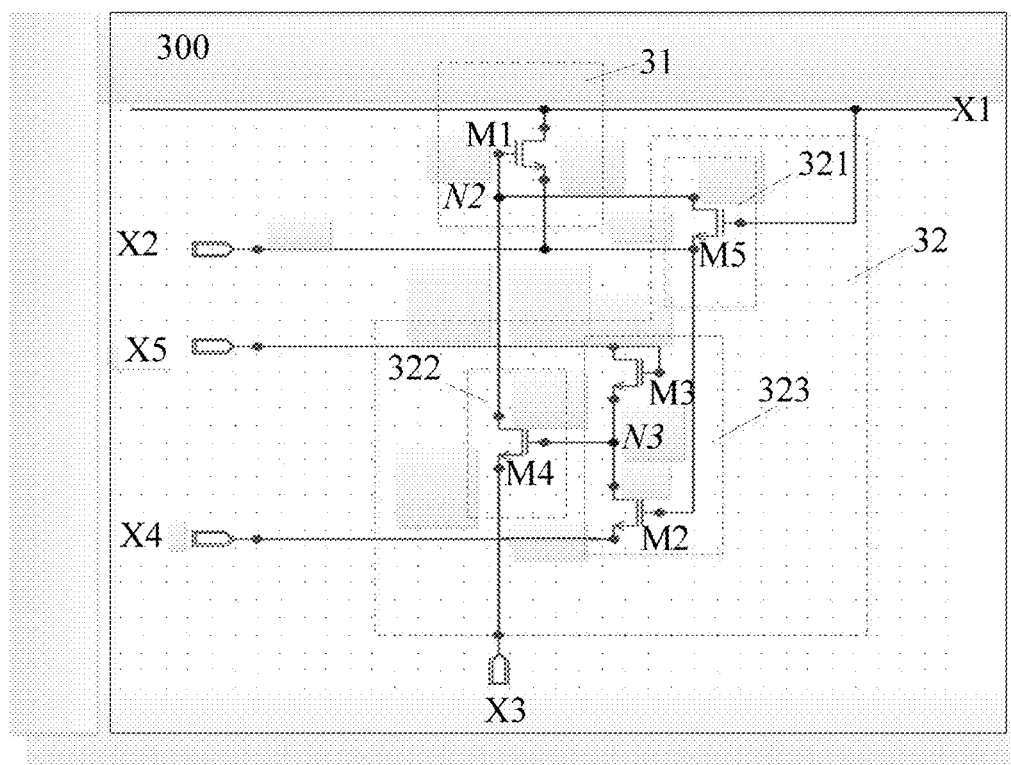
FIG. 4 is a schematic diagram illustrating the detailed circuit structure of the reset circuit as shown in FIG. 3.

As shown in FIG. 4, the reset unit 31 can comprise a first transistor M1. A gate electrode of the first transistor M1 is coupled to the second node N2. One of a source electrode and a drain electrode of the first transistor M1 is coupled to the first input terminal X1, and the other of the source electrode and the drain electrode is coupled to the second input terminal X2. The first transistor M1 is configured to be turned on by a level substantially equal to the first level.

As such, the function of the reset unit 31 can be easily realized: the reset unit 31 is turned on when the voltage at the second node N2 is at the first level, which in turn electrically couple the second input terminal X2 with the first input terminal X1.

As shown in FIG. 4, the reset control unit 32 can comprise a first control subunit 321, a second control subunit 322, and a third control subunit 323. The first control subunit 321 is coupled to the first input terminal X1, the second input terminal X2, and the second node N2. The first control subunit 321 is configured to be turned on when the first input terminal X1 is at the first level, in turn electrically connecting the second node N2 with the second input terminal X2.

The second control subunit 322 is coupled to the third input terminal X3, the second node N2, and a third node N3. The second control subunit 322 is configured to electrically couple the second node N2 with the third input terminal X3 when a voltage at the third node N3 is equal to an effective level of the second control subunit 322.

The third control subunit 323 is coupled to the second input terminal X2, a fourth input terminal X4, a fifth input terminal X5, and the third node N3. The third control subunit 323 is configured to set a voltage at the third node N3 to be an ineffective level of the second control subunit 322 when the second input terminal X2 is at the first level, and to set the voltage at the third node N3 to be the effective level of the second control subunit 322 when the second input terminal X2 is at the second level.

The working principle of the reset control unit 32 as described above is as follows.

When the second input terminal X2 is at the second level, the third control subunit 323 sets the voltage at the third node N3 to be the effective level of the second control subunit 322, which in turn sets the voltage at the second node N2 to be the voltage that is input to the third input terminal X3.

When the second input terminal X2 is at the first level, the third control subunit 323 can set the voltage at the third node N3 to be the ineffective level of the second control subunit 322, which in turn causes the second control subunit 322 unable to turn on, thus the voltage at the second node N2 cannot be the voltage that is input to the third input terminal X3.

At the same time, if the first input terminal X1 is at the first level, the first control subunit 321 can electrically couple the second node N2 with the second input terminal X2; and as such, the voltage at the second node N2 is set as the voltage at the second input terminal X2, thereby realizing the basic resetting function for the reset control unit 32.

It is understandable that regardless of the technical solutions, if the various control subunits in one technical solution can achieve their respective basic functions without affecting the corresponding function or implementation of the reset control unit 32, the technical solution shall be covered by the scope of the present disclosure.

It is noted that the third control subunit 323 essentially plays a role of switching signals. When the second input terminal X2 is at the first level, the voltage at the third node N3 is set as the ineffective level of the second control subunit 322; whereas when the second input terminal X2 is at the second level, the voltage at the third node N3 is set as the effective level of the second control subunit 322.

It is understandable that if the effective level of the second control subunit 322 is the second level and the ineffective level of the second control subunit 322 is the first level, the third control subunit 323 is not needed in some alternative embodiments of the present disclosure. As such, the second input terminal X2 can be directly coupled to the third node N3.

However, if the effective level of the second control subunit 322 is the first level and the ineffective level of the second control subunit 322 is the second level, the third control subunit 323, or a similar module, is needed to perform the level switch.

It is also understandable that the effective level and the ineffective level of the second control subunit 322 are opposite levels. When the voltage at the third node N3 is the ineffective level of the second control subunit 322, the second control subunit 322 does not operate to electrically couple the second node N2 with the third input terminal X3.

A detailed description of the various control subunits is provided with reference to FIG. 4. The third control subunit 323 can include a second transistor M2 and a third transistor M3.

A gate electrode of the second transistor M2 is coupled to the second input terminal X2; one of a source electrode and a drain electrode of the second transistor M2 is coupled to the fourth input terminal X4, and the other of the source electrode and the drain electrode of the second transistor M2 is coupled to the third node N3. The second transistor M2 is configured to be turned on by a level substantially equal to the first level.

A gate electrode, and one of a source electrode and a drain electrode, of the third transistor M3 is coupled to the fifth input terminal X5, and the other of the source electrode and the drain electrode of the third transistor M3 is coupled to the third node N3. The third transistor M3 is configured to be turned on by a level substantially equal to the effective level of the second control subunit 322.

During operation, a first DC voltage substantially equal to the ineffective level of the second control subunit 322 can be applied to the fourth input terminal X4, and a second DC voltage substantially equal to the effective level of the second control subunit 322 can be applied to the fifth input terminal X5, to thereby realize the function of the third control subunit 323 as described above.

Specifically, when the first level is applied to the second input terminal X2, the second transistor M2 is turned on, causing a level at the third node N3 to be set as the ineffective level of the second control subunit 322.

During implementation, it can be achieved by setting the parameters of a fourth transistor M4, or by setting the voltage that is input from the fourth input terminal X4 and/or a fifth input terminal X5, or by setting the width/length ratio of the second transistor M2 and of the third transistor M3 to allow the fourth transistor M4 to be turned off when the second transistor M2 and the third transistor M3 are both turned on.

When the second level is applied to the second input terminal X2, the second transistor M2 is electrically cut off, and only the third transistor M3 is turned on, which causes a level at the third node N3 to be set as the effective level of the second control subunit 322.

By these above configuration, the function of second control subunit 322 is thus realized.

As shown in FIG. 4, the second control subunit 322 and the first control subunit 321 can be configured to each comprise one transistor.

In some embodiments, the second control subunit 322 can comprise the fourth transistor M4. A gate electrode of the fourth transistor M4 is coupled to the third node N3; one of a source electrode and a drain electrode of the fourth transistor M4 is coupled to the third input terminal X3, and the other of the source electrode and the drain electrode of the fourth transistor M4 is coupled to the second node N2. The fourth transistor M4 is configured to be turned on by a level substantially equal to the effective level of the second control subunit 322.

In some embodiments, the first control subunit 321 can comprise the fifth transistor M5. A gate electrode of the fifth transistor M5 is coupled to the first input terminal X1; one of a source electrode and a drain electrode of the fifth transistor M5 is coupled to the second node N2, and the other of the source electrode and the drain electrode of the fifth transistor M5 is coupled to the second input terminal X2. The fifth transistor M5 is configured to be turned on by a level substantially equal to the first level.

In some preferred embodiments, the various transistors M1, M2, M3, M4, and M5 can be N-type transistors; the first level can be a high level, and the second level can be a low level; the effective level of the second control subunit 322 can be a high level, and the ineffective level of the second control subunit 322 can be a low level. As such, the various transistors can be manufactured by a same fabrication process, which can simplify the manufacturing.

Alternatively, some of the transistors can be a P-type transistor. For example, the transistor M2, the transistor M3, and the transistor M4, can all be P-type transistors.

With reference to FIG. 4, where the reset unit 31 comprises a transistor M1, the reset control unit 32 comprises transistors M2, M3, M4, and M5, the first level is a high level, the second level is a low level, the effective level and the ineffective level of the second control subunit 322 are respectively the first level and the second level, a detailed description of a driving method of the reset circuit is provided.

Figure 5:
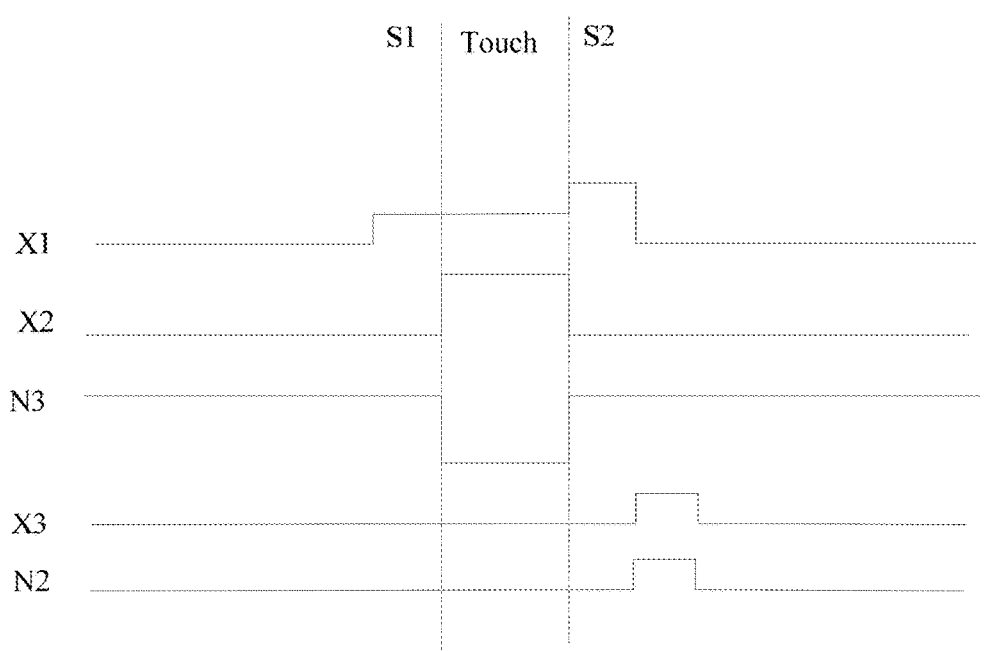
FIG. 5 is a schematic diagram illustrating timing sequence states of key signals during operation of the reset circuit as shown in FIG. 4.

As shown in FIG. 5, the method for driving the reset circuit as shown in FIG. 4 comprises:

Applying a constant low-level voltage to the fourth input terminal X4 and a constant high-level voltage to the fifth input terminal X5 (alteration of the voltages applied to the fourth input terminal X4 and to the fifth input terminal X5 is not shown in the figure);

Applying a low level to the second input terminal X2 at both the first scanning stage S1 and the second scanning stage S2. This can cause the second transistors M2 to be electrically cut off, in turn the third transistor M3 can set the third node N3 to be at a high level upon application of the high level to the fourth input terminal X4. The fourth transistor M4 is then turned on, and the second node N2 and the third input terminal X3 are thus electrically coupled, i.e., connected to the reset control signal terminal RESET.

During the first scanning stage S1 and the second scanning stage S2, when the first node PU is at a high level (i.e. the first input terminal is at a high level), the fifth transistor M5 is turned on, in turn causing the second input terminal X2 and the second node N2 to be electrically coupled.

As such, if the first transistor M1 is turned on upon application of a reset control signal to the reset control signal terminal RESET, the first input terminal X1 and the second input terminal X2 are electrically coupled, causing the first input terminal X1 to be pulled down to thereby realizing the resetting process.

A Touch stage is arranged between the first scanning stage S1 and the second scanning stage S2. The Touch stage starts when the first scanning stage S1 completes, and the Touch stage ends when the second scanning stage S2 starts.

During the Touch stage, the second input terminal X2 is applied with a high level, causing the second transistor M2 to be turned on. This causes the third node N3 to be pulled down, in turn causing the fourth transistor M4 to be turned off. The third input terminal X3 is not electrically coupled to the second node N2, and correspondingly the reset control signal from the reset control signal terminal RESET cannot be input to the second node N2.

At the same time, because the first node PU is usually at a high level, the fifth transistor M5 is turned on, causing the second node N2 and the second input terminal X2 to be electrically coupled. This then causes the first transistor M1 to be turned on, in turn the first input terminal X1 is electrically coupled to the second input terminal X2.

As such, the second input terminal X2 can charge the first node PU, which allows the first node PU to be maintained at a high level. Consequently, the issue that the electrical leakage during the Touch stage causes the gate scanning circuit unable to operate in a continuous way can thus be avoided.

Figure 6:
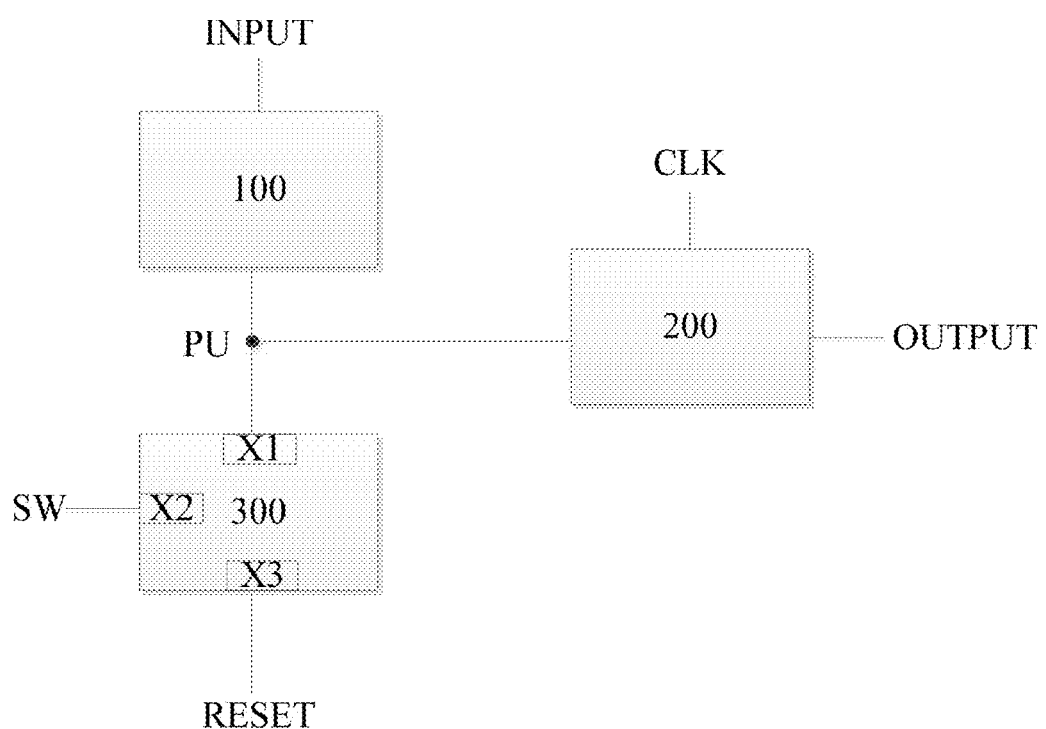
FIG. 6 is a schematic diagram of the structure of a shift register unit according to some embodiments of the present disclosure.

In a second aspect, the present disclosure provides a shift register unit, as illustrated in FIG. 6. The shift register includes: an input circuit 100, an output circuit 200, and a reset circuit 300. The input circuit 100 is coupled to a scan signal input terminal INPUT, and a first node PU, and is configured to set the first node to be at a first level upon receiving a scan signal.

The output circuit 200 is coupled to the first node PU via a control terminal, and is coupled to a clock signal input terminal CLK and a scan signal output terminal OUTPUT. The output circuit 200 is configured to output the scan signal from the scan signal output terminal OUTPUT when the first node PU is at the first level.

The reset circuit 300 can be any of the embodiments as described above. A first input terminal X1, a third input terminal X3, and a second input terminal X2 of the reset circuit 300 are respectively coupled to the first node PU, the reset control signal terminal RESET, and a control signal terminal SW.

The shift register unit can further include a second reset circuit, configured to reset the output terminal of the output circuit 200. The structure of the input circuit 100, the output circuit 200, and the second reset circuit can be referenced to conventional technologies and their descriptions are thus skipped herein.

In a third aspect, the present disclosure provides a gate scanning circuit, which includes a plurality of shift register units that are coupled through a cascade connection. Except the first-level shift register unit and the last-level shift register unit, all other-level shift register units comprises at least one shift register unit as described above.

In some embodiments of the gate scanning circuit, some of the shift register units can comprise the shift register unit as described above, and others can comprise ordinary shift register unit, such as those shown in FIG. 1. Correspondingly, during the driving process, the starting time of the scanning termination stage can be configured to comprise a certain moment after the first node of the shift register unit containing the reset circuit is at the first level and before the scan signal is output.

The cascade connections of the various shift register units as described above can be referenced to current technologies, and are not described herein.

In a fourth aspect, the present disclosure provides a display apparatus, comprising a gate scanning circuit according to any one of the embodiments as described above.

The display apparatus can be an e-paper, a cell phone, a tablet, a television, a monitor, or a display screen of a notebook computer, a digital camera, a GPS, or other similar electronics.

In some embodiments, the display apparatus can be an in-cell touch panel. It should be noted that the reset circuit, the shift register unit and the gate scanning circuit as disclosed in this present disclosure can be applied to other apparatuses requiring interrupt scan, and thus there is no limitation herein.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A reset circuit for compensating a reduction of a level at a first node of a circuit during a first stage without affecting levels at the first node during a second stage, comprising a reset unit circuit, a reset control unit circuit, and at least three input terminals, wherein:

the at least three input terminals comprise a first input terminal, a second input terminal, and a third input terminal, wherein the first input terminal is coupled to the first node;

the reset unit circuit is coupled to the first input terminal, the second input terminal, and a second node, and is configured to be turned on if the second node is at a first level, so as to electrically couple the second input terminal with the first input terminal; and the reset control unit circuit is coupled to the first input terminal, the second input terminal, the third input terminal, and the second node, and is configured to electrically couple the second input terminal with the second node if the first input terminal is at the first level, and to electrically couple the second node with the third input terminal if the second input terminal is at a second level.

2. The reset circuit of claim 1, wherein the first stage comprises an interrupt stage, and the second stage comprises at least one stage other than the interrupt stage.

3. The reset circuit of claim 2, wherein the reset unit circuit comprises a first transistor, wherein:

the first transistor is configured to be turned on by a level substantially equal to the first level;

a gate electrode of the first transistor is coupled to the second node;

one of a source electrode and a drain electrode of the first transistor is coupled to the first input terminal; and another of the source electrode and the drain electrode is coupled to the second input terminal.

4. The reset circuit of claim 2, wherein the reset control unit circuit comprises a first control subunit circuit and a second control subunit circuit, wherein:

the first control subunit circuit is coupled to the first input terminal, the second input terminal, and the second node, and is configured to be turned on if the first input terminal is at the first level, so as to electrically couple the second node with the second input terminal; and the second control subunit circuit is coupled to the third input terminal, the second node, and a third node, and is configured to turned on if a voltage at the third node is substantially equal to an effective level of the second control subunit circuit, so as to electrically couple the second node with the third input terminal.

5. The reset circuit of claim 4, wherein the effective level and an ineffective level of the second control subunit circuit are substantially equal to the second level and the first level respectively, and the second input terminal is coupled to the third node.

6. The reset circuit of claim 4, wherein the effective level and an ineffective level of the second control subunit circuit are substantially equal to the first level and the second level respectively, and the reset circuit further comprises a third control subunit circuit, wherein:

the third control subunit circuit is coupled to the second input terminal and the third node, and is configured to set a voltage at the third node to be the ineffective level of the second control subunit circuit if the second input terminal is at the first level, and to set the voltage at the third node to be the effective level of the second control subunit circuit if the second input terminal is at the second level.

7. The reset circuit of claim 6, wherein the third control subunit circuit comprises:
 a second transistor, configured to be turned on by a level substantially equal to the first level; and
 a third transistor, configured to be turned on by a level substantially equal to the effective level of the second control subunit circuit;
 wherein:
  a gate electrode of the second transistor is coupled to the second input terminal; one of a source electrode and a drain electrode of the second transistor is coupled to a fourth input terminal, and another of the source electrode and the drain electrode of the second transistor is coupled to the third node; and
  a gate electrode, and one of a source electrode and a drain electrode, of the third transistor is coupled to a fifth input terminal, and another of the source electrode and the drain electrode of the third transistor is coupled to the third node.

8. The reset circuit of claim 4, wherein the second control subunit circuit comprises a fourth transistor, wherein:
 the fourth transistor is configured to be turned on by a level substantially equal to the effective level of the second control subunit circuit;
 a gate electrode of the fourth transistor is coupled to the third node;
 one of a source electrode and a drain electrode of the fourth transistor is coupled to the third input terminal, and
 another of the source electrode and the drain electrode of the fourth transistor is coupled to the second node.

9. The reset circuit of claim 4, wherein the first control subunit circuit comprises a fifth transistor, wherein:
 the fifth transistor is configured to be turned on by a level substantially equal to the first level;
 a gate electrode of the fifth transistor is coupled to the first input terminal;
 one of a source electrode and a drain electrode of the fifth transistor is coupled to the second node; and
 another of the source electrode and the drain electrode of the fifth transistor is coupled to the second input terminal.

10. The reset circuit of claim 4, wherein the first level is a high level, and the second level is a low level.

11. The reset circuit of claim 1, wherein the third input terminal is coupled to a reset control signal terminal, configured to send a reset control signal to turn on the reset unit circuit during the second stage.

12. The reset circuit of claim 2, wherein the circuit is a shift register unit circuit.

13. The reset circuit of claim 12, wherein:
 the shift register unit circuit is part of a gate scanning circuit; and
 the interrupt stage in the first stage is a touch detection stage.

14. The reset circuit of claim 13, wherein the second stage comprises a first scanning stage and a second scanning stage, wherein:
 a starting time of the interrupt stage is an ending time of the first scanning stage, and an ending time of the interrupt stage is a starting time of the second scanning stage;
 at the first scanning stage and the second scanning stage, the second input terminal is applied with the second level; and
 at the interrupt stage, the second input terminal is applied with the first level.

15. A shift register unit circuit, comprising the reset circuit according to claim 1, an input circuit, and an output circuit.

16. The shift register unit circuit of claim 15, wherein the input circuit is coupled to a scan signa input terminal and the first node; and the output circuit is coupled to the first node via a control terminal.

17. The shift register unit circuit of claim 16, wherein:
 the input circuit is configured to set the first node to be at the first level upon receiving a scan signal; and
 the output circuit is coupled to a clock signal input terminal and a scan signal output terminal, and is configured to output the scan signal from the scan signal output terminal if the first node is at the first level.

18. The shift register unit circuit of claim 16, wherein the second input terminal and the third input terminal of the reset circuit are respectively coupled to a control signal terminal and a reset control signal terminal.

19. A gate scanning circuit, comprising at least one shift register unit circuit according to claim 15.

20. The gate scanning circuit according to claim 19, comprising a plurality of shift register unit circuits, wherein:
 the plurality of shift register unit circuits are coupled through a cascade connection; and
 the plurality of shift register unit circuits other than a first-level shift register unit circuit and a last-level shift register unit circuit comprise at least one shift register unit circuit.

* * * * *